(12) United States Patent
Parker et al.

(10) Patent No.: US 12,484,134 B2
(45) Date of Patent: Nov. 25, 2025

(54) ELECTRIC FENCE ENERGIZERS AND METHODS FOR EARTHING SAME

(71) Applicant: Gallagher Group Limited, Hamilton (NZ)

(72) Inventors: Anthony Ian Parker, Wellington (NZ); Thomas Ritchie, Hamilton (NZ)

(73) Assignee: Gallagher Group Limited, Hamilton (NZ)

( * ) Notice: Subject to any disclaimer, the term of this patent is extended or adjusted under 35 U.S.C. 154(b) by 65 days.

(21) Appl. No.: 17/911,104

(22) PCT Filed: Mar. 15, 2021

(86) PCT No.: PCT/NZ2021/050039
§ 371 (c)(1),
(2) Date: Sep. 12, 2022

(87) PCT Pub. No.: WO2021/182978
PCT Pub. Date: Sep. 16, 2021

(65) Prior Publication Data
US 2023/0103491 A1   Apr. 6, 2023

(30) Foreign Application Priority Data
Mar. 13, 2020   (NZ) ........................ 762633

(51) Int. Cl.
*H05C 1/04*   (2006.01)
*A01K 3/00*   (2006.01)
(Continued)

(52) U.S. Cl.
CPC .............. *H05C 1/04* (2013.01); *A01K 3/005* (2013.01); *E04H 17/017* (2021.01);
(Continued)

(58) Field of Classification Search
CPC ........ H05C 1/04; A01K 3/005; E04H 17/017; H05K 5/0086; H05K 5/0204; H05K 5/06;
(Continued)

(56) References Cited

U.S. PATENT DOCUMENTS 2,530,247 A * 11/1950 Koonz ................. H01B 17/145
256/45
4,078,771 A *  3/1978 Diggs ..................... A01K 1/105
256/10

(Continued)

FOREIGN PATENT DOCUMENTS

CA      2781188 A1 * 11/2013  ............. E04H 17/20
DE     19952814 A1    5/2001
(Continued)

OTHER PUBLICATIONS

D. J. Thrimawithana and U. K. Madawala, "Pulse Propagation Along Single-Wire Electric Fences," in IEEE Transactions on Power Delivery, vol. 23, No. 4, pp. 2302-2309, Oct. 2008, doi: 10.1109/TPWRD.2008.2002653 (Year: 2008).*

(Continued)

*Primary Examiner* — Sreeya Sreevatsa
(74) *Attorney, Agent, or Firm* — Bradley Arant Boult Cummings LLP; Henry B. Ward, III

(57) ABSTRACT

A portable electric fence energizer is described, having a housing and an electric pulse generating circuit located within the housing. The energizer further includes a post securing mechanism configured to secure the housing relative to an electrically conductive post. The post securing mechanism includes at least one electrical contact configured to contact the post when secured by the post securing mechanism. A conductive link between the electrical contact and the electric pulse generating circuit may be used to provide an earth connection for the energiser, or an output (Continued)

connection between the electric pulse generating circuit and a wire of the electric fence.

18 Claims, 13 Drawing Sheets

(51) Int. Cl.
    *E04H 17/00*         (2006.01)
    *H05K 5/00*          (2025.01)
    *H05K 5/02*          (2006.01)
    *H05K 5/06*          (2006.01)

(52) U.S. Cl.
    CPC ......... *H05K 5/0086* (2013.01); *H05K 5/0204* (2013.01); *H05K 5/06* (2013.01)

(58) Field of Classification Search
    CPC ...... H05K 9/0064; H05K 5/0095; H05K 7/12; H05K 5/063; Y02E 10/56; H02J 2300/24
    USPC ......................................................... 361/232
    See application file for complete search history.

(56) References Cited

U.S. PATENT DOCUMENTS

| | | | |
|---|---|---|---|
| 2003/0222253 A1* | 12/2003 | Langlie | .................. A01K 3/005 256/10 |
| 2015/0300558 A1* | 10/2015 | Bishop | .................. F16M 13/02 248/219.4 |
| 2017/0370120 A1* | 12/2017 | Billings | .................. E01F 9/669 |

FOREIGN PATENT DOCUMENTS

| | | | | | |
|---|---|---|---|---|---|
| FR | 1258378 A | * | 4/1961 | | |
| GB | 706316 A | | 3/1954 | | |
| GB | 2329652 A | * | 3/1999 | ........... | E04H 17/017 |
| JP | 2008061562 A | * | 3/2008 | | |

OTHER PUBLICATIONS

International Search Report issued for International Patent Application No. PCT/NZ2021/050039, dated Jul. 12, 2021.
Written Opinion issued for International Patent Application No. PCT/NZ2021/050039, dated Jul. 12, 2021.

* cited by examiner

ELECTRIC FENCE ENERGIZERS AND METHODS FOR EARTHING SAME

STATEMENT OF CORRESPONDING APPLICATIONS

This application is based on the specification filed in relation to PCT/NZ2021/050039 and the specification filed in relation to New Zealand Patent Application No. 762633, the entire contents of both of which are incorporated herein by reference.

TECHNICAL FIELD

The present invention relates to electric fence energizers, more particularly earthing of portable electric fence energizers and housings for same.

BACKGROUND

Energizers are commonly used in the agricultural industry to provide cost effective fencing of animals, emitting electrical impulses over at least one conductive fencing element of a fence to deter contact with the fence. In various applications—for example strip grazing, temporary fencing or setting up electric fencing where there is unreliable or no mains power—it is desirable for the energizer to be self-sufficient in terms of a power source and readily repositioned. To this end, energizers have been developed which use solar panels and/or batteries as power sources, typically of a size and weight to allow for portability.

A strong connection to earth is highly important for enabling an energiser to deliver an effective shock pulse. This is typically provided by a lead connected between a stake driven into the ground and a terminal of the energiser. However, this increases the number of components and potentially adds time and complexity to installation and relocation. Further, there is potential for such leads to become dislodged and disrupt operation of the electric fence system, particularly where the leads have easily released connectors (for example alligator clips) to facilitate ease of relocation and installation.

The use of solar panels and/or batteries as power sources also introduces challenges such as securing external solar panels to the housing of the energizer, sealing associated electronics, and managing temperatures within the housing of the energizer.

It is an object of the present disclosure to address at least one of the foregoing problems or at least to provide the public with a useful choice.

All references, including any patents or patent applications cited in this specification are hereby incorporated by reference. No admission is made that any reference constitutes prior art. The discussion of the references states what their authors assert, and the applicants reserve the right to challenge the accuracy and pertinency of the cited documents. It will be clearly understood that, although a number of prior art publications are referred to herein, this reference does not constitute an admission that any of these documents form part of the common general knowledge in the art, in New Zealand or in any other country.

Unless the context clearly requires otherwise, throughout the description and the claims, the words "comprise", "comprising", and the like, are to be construed in an inclusive sense as opposed to an exclusive or exhaustive sense, that is to say, in the sense of "including, but not limited to".

Further aspects and advantages of the present disclosure will become apparent from the ensuing description which is given by way of example only.

SUMMARY

According to one aspect of the present technology there is provided a portable electric fence energizer including:
a housing;
an electric pulse generating circuit located within the housing;
a post securing mechanism configured to secure the housing relative to an electrically conductive post, wherein the post securing mechanism includes at least one electrical contact configured to contact the post when secured by the post securing mechanism; and
a conductive link between the electrical contact and the electric pulse generating circuit.

According to one aspect of the present technology there is provided a system including a portable electric fence energizer substantially as herein described, and an electrically conductive post.

In examples, the electrical contact may be configured to provide an earth connection for the energiser—i.e. be an earth electrical contact. In such an example, the electrically conductive post includes an electrically conductive portion configured to be inserted into the ground. In use the electrically conductive post may be inserted into the ground, with a connection to earth provided to the electric pulse generating circuit via the electrical contact and conductive link.

In examples, the electrical contact may be configured to provide an output connection between the electric pulse generating circuit and a wire of the electric fence (whether directly or indirectly)—i.e. be an output electrical contact.

For example, the post may include an electrically conductive wire support configured to support a wire of the electric fence. An electric shock pulse may be delivered to the wire support via the output electrical contact and the portion of the post in contact with the output electrical contact.

In another example, the energizer may have a wire support portion including the output electrical contact. In such an example, the energiser supports a wire of the electric fence directly, using the wire support portion, and delivers electric shock pulses onto the wire via the output electrical contact.

In examples, the energiser may include an output electrical contact and an earth electrical contact.

In an example, the energizer may be configured for use with an electrically conductive post including a first conductive portion having an end configured to be inserted into the ground in use, a second conductive portion having a wire support configured to support a wire of the electric fence, wherein the first conductive portion is electrically insulated from the second conductive portion. As an example, the post may be a "Heavy Duty Live Tip Treadin" portable fence post provided by Gallagher Group Limited.

In such an example, the energizer may be configured such that when the post is secured to the housing using the post securing mechanism, in use, the earth electrical contact contacts the first conductive portion of the post, and the output electrical contact contacts the second conductive portion of the post.

In an example the post securing mechanism may include:
a shaft having a post receiving portion into which a portion of the post may be inserted in use;

a clamping member configured to be received on the shaft and tightened to bear against the post to secure the post relative to the housing, wherein the electrical contact is positioned in the post receiving portion such that tightening of the clamping member bears the post against the electrical contact.

In an example, the post receiving portion of the threaded shaft may be a slot in the side of the shaft. It is envisaged that the slot may intersect at least one end of the shaft to allow for introduction or removal of the post through that end. It should be appreciated that this is not intended to be limiting to all examples—for example the post receiving portion may be an aperture in the side of the shaft.

In an example, the shaft may be made of an electrically insulating material. In an alternative example, the shaft may be electrically conductive and provide the function of the electrical contact.

In examples the shaft and the clamping member may have complementary helical threads—i.e. the clamping member may be rotated to provide linear translation along the shaft. It should be appreciated that this is not intended to be limiting to all examples of the present technology, and that other mechanisms for releasably fastening the clamping member relative to the shaft are contemplated.

In an example, the post securing mechanism may include a conductive clamping member configured to act as the electrical contact. For example, the housing may include a post receiving portion configured to locate the post, with the conductive clamping member positioned over the post and secured to bear against the post and clamp the post to the post receiving portion.

In an example the clamping member may be configured to pivot relative to the post receiving portion to facilitate insertion and withdrawal of the post from the post receiving portion.

In examples in which the energizer is configured for use with an electrically conductive post including a first conductive portion and a second conductive portion, the post securing mechanism may be configured to act against one of the first conductive portion or the second conductive portion. In such examples, it is envisaged that the electrical contact associated with the other conductive portion may be biased towards the other conductive portion (for example using a leaf spring or a coil spring) to increase the likelihood of contact. It should be appreciated that this is not intended to be limiting to all examples, as examples are contemplated in which both, or neither, of the electrical contacts are biased towards the post.

In examples in which the energizer includes photovoltaic cells (i.e. a solar panel, whether integrated into or otherwise permanently secured to the housing, or releasably secured to the housing), the post securing mechanism may be configured to secure the housing relative to the post such that the solar panel is orientated to be angled upwardly relative to ground.

According to one aspect of the present technology there is provided a portable electric fence energizer including:
a photovoltaic cell panel;
a housing, including a front wall having a wire aperture;
wherein the photovoltaic cell panel is secured to the housing using an adhesive applied between the photovoltaic cell panel and the front wall, wherein the adhesive is formed in an annular ring surrounding the wire aperture to provide a watertight seal.

In examples, the front wall may include a plurality of fastener apertures, wherein the adhesive is applied between the photovoltaic cell panel and an exterior surface of the front wall, wherein the adhesive extends through each of the fastener apertures and forms a plurality of expanded anchor portions on an interior surface of the front wall.

According to one aspect of the present technology there is provided a portable electric fence energizer including:
a photovoltaic cell panel;
a housing, including a front wall having a plurality of fastener apertures;
wherein the photovoltaic cell panel is secured to the housing using an adhesive applied between the photovoltaic cell panel and an exterior surface of the front wall, wherein the adhesive extends through each of the fastener apertures and forms a plurality of expanded anchor portions on an interior surface of the front wall.

In examples, the housing may include a plurality of anchor baffles, each anchor baffle provided to a respective fastener aperture, each anchor baffle including a baffle surface facing the faster aperture, such that adhesive extruded through the fastener aperture contacts the baffle surface and is directed laterally across the interior surface of the front wall.

In examples, each fastener aperture may be tapered between the interior surface and the exterior surface—i.e. the cross-sectional area of the fastener aperture is greater at the interior surface, and tapers to a smaller cross-sectional area at the exterior surface.

In examples, the front wall includes a wire aperture, wherein the photovoltaic cell panel is secured to the housing using an adhesive applied between the photovoltaic cell panel and the front wall, wherein the adhesive is formed in an annular ring surrounding the wire aperture to provide a watertight seal.

In examples, the front wall includes a plurality of panel spacing members against which the photovoltaic cell panel is seated, such that an air gap is provided between the photovoltaic cell panel and the front wall.

According to one aspect of the present technology there is provided a portable electric fence energizer including:
an electric pulse generating circuit;
a housing, including:
a first housing member;
a second housing member, wherein the second housing member is configured to be secured to the first housing member to provide an enclosure in which the electric pulse generating circuit is located;
wherein the housing includes a labyrinth perimeter seal between the first housing member and the second housing member, the labyrinth perimeter seal including an airgap and configured to permit airflow between an interior of the enclosure and an exterior of the enclosure, and inhibit ingress of liquid into the enclosure.

In examples, the first housing member includes a first labyrinth perimeter seal surface, and the second housing member includes a second labyrinth perimeter seal surface, wherein the first labyrinth perimeter seal surface faces the second labyrinth perimeter seal surface, and the first labyrinth perimeter seal surface and the second labyrinth perimeter seal surface are separated by a plurality of spacer features.

In examples, the housing includes a peripheral wall around which the labyrinth perimeter seal extends, wherein the peripheral wall includes a superior facing portion and an inferior facing portion, wherein the airgap of the labyrinth perimeter seal is greater through the inferior portion than the superior portion.

The above and other features will become apparent from the following description and the attached drawings.

BRIEF DESCRIPTION OF THE DRAWINGS

Further aspects of the present disclosure will become apparent from the following description which is given by way of example only and with reference to the accompanying drawings in which.

DETAILED DESCRIPTION

Figure 1:
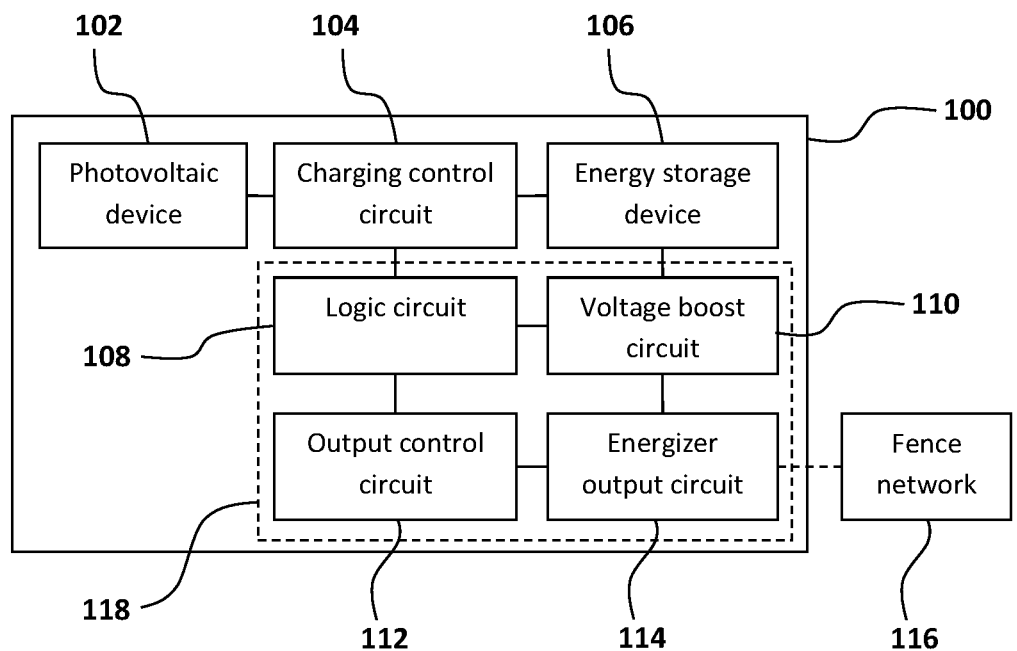
FIG. 1 shows a block diagram of electrical components of an electric fence energizer.

FIG. 1 shows a block diagram of electrical components of an exemplary energizer according to one aspect of the present technology, in this example configured as a solar energizer 100. For completeness, it should be noted that while it is envisaged that aspects of the present technology may have particular application to solar energizers, this is not intended to be limiting to all examples.

At a high level, the solar energizer 100 includes a photovoltaic device 102 which is connected to a charging control circuit 104 which in turn connects to an energy storage device 106. The photovoltaic device 102 includes photovoltaic cells which harvest energy from the sun. This energy is provided to the energy storage device 106 via the charging circuit 104. A logic circuit 108 controls the charging control circuit 104 to vary the amount of energy provided to the energy storage device 106. It should be appreciated that in exemplary embodiments the charging control circuit 104 may operate independent of the logic circuit 108 and in some embodiments may be integrated into the photovoltaic device 102.

In an example the energy storage device 106 is a rechargeable battery, although it should be appreciated that in other examples the energy storage device 106 may be capacitive, such as an electrolytic or super capacitor, or a hybrid means of storage including both capacitive and electrochemical storage. It is also to be appreciated that the battery need not be rechargeable, and may instead be configured to only provide power in the absence of solar energy. Additionally, the energy storage device may include multiple batteries, such as two 6-volt lead-acid batteries in series or parallel, or any suitable arrangement of Lithium-type rechargeable battery. In an exemplary embodiment the batteries may be configured so that in-use one battery is used almost exclusively and the second battery is provided as a back-up should the first battery fail. In terms of capacity, it is envisaged the energy storage device may enable the energizer to operate for an extended period of time (such as several hours to days) in the absence of solar power.

It is envisaged that the charging control circuit 104 may be configured to maintain the energy storage device 105 at near full charge when solar power is available. When the energy storage device 106 is fully charged, or near full charge, the charging control circuit 104 may disconnect the photovoltaic device 102 from the energy storage device 106 to protect the device 106 from overcharging. The charging control circuit 104 may also include a mechanism to prevent the energy storage device 106 from discharging back into the photovoltaic device 102 in the event that the stored voltage is higher voltage than the output of the photovoltaic device 102. For example, this may be a transistor—such as a field-effect transistor (FET)—however as those skilled in the art would appreciate there may be a number of alternate mechanisms suitable for this purpose, such as diodes. It is also to be appreciated that the mechanism may be included as part of the photovoltaic device 102. It is also appreciated that the charging control circuit 104 may also include an alternative means of charging the energy storage device 106 such as an additional AC or DC power connection and associated components configured to provide voltage regulation where required.

The logic circuit 108 may include a controller such as a microcontroller or processor, and an associated memory storing instructions for execution by the controller. The logic circuit 108 is configured to provide a number of functions, including: selecting between operating modes, controlling the charging control circuit 104 to charge the energy storage device 106, controlling the timing of a voltage boost circuit 110, and controlling an output control circuit 112 in order to determine when the energizer output circuit 114 should be activated to transfer a pulse to a fence network 116. The logic circuit 108 may also be configured to monitor and control operation of the energizer in accordance with predetermined safety protocols.

The output of the energizer 100 is typically a voltage impulse measuring several thousand volts, and as such the voltage boost circuit is configured to increase the voltage from the energy storage device 106 and/or the photovoltaic device 102 by several magnitudes prior to discharge by the energizer output circuit 114. The voltage boost circuit 110 may be, for example, a voltage multiplier, inverter, boost regulator, fly-back converter or any other means known to those skilled in the art.

The energizer output circuit 114 may include an output transformer, configured to further boost the voltage of the impulses delivered to the fence network 116. Timing of the impulses is controlled by the logic circuit 108 via the output control circuit 112. The output control circuit 112 may include a silicon controller rectifier (SCR) or thyristor. However, this should not be seen as limiting and it would be apparent to those skilled in the art that a number of other switching devices could be implemented such as transistors.

For ease of reference, the logic circuit 108, voltage boost circuit 110, output control circuit 112 and energizer output circuit 114 may be referred to collectively as an electric pulse generating circuit 118. The electric pulse generating circuit 118 requires a connection to earth to allow for a circuit to be completed between an animal contacting the fence network 116 and the energizer 100.

Figure 2:
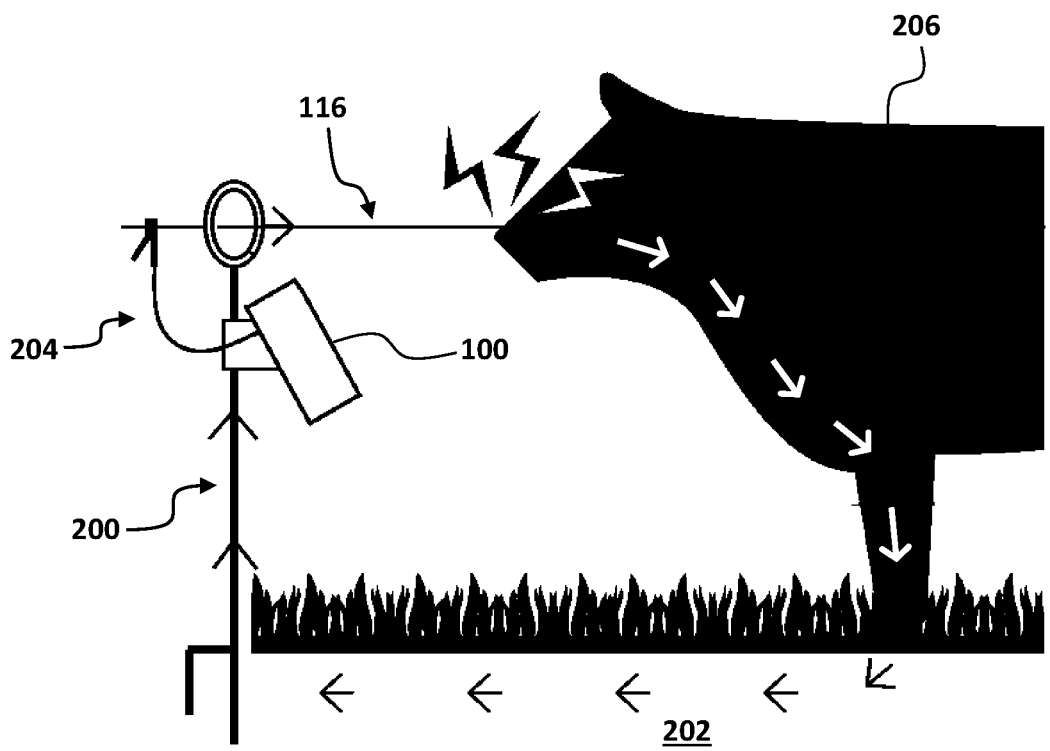
FIG. 2 illustrates an electrical circuit produced during operation of an electric fence energizer.

Referring to FIG. 2, the present technology provides means through which the earth connection may be provided to the energiser 100 through a conductive fence post 200 inserted into the ground 202. The energiser is mounted to the post 200 using a post securing mechanism, examples of which will be described below, to provide an electrical connection to earth. In operation, the energiser 100 delivers electrical impulses onto the fence network 116 (in this example via a lead 204 between the energizer 100 and the fence network 116). An animal 206 contacting the fence 116 completes a circuit between the fence 116 and the ground 202 (and therefore the energizer 100) and experiences a shock as a result. It will be appreciated that the effectiveness of the shock is dependent on conductivity of the entire circuit, and that the earth connection is therefore highly important to effective operation.

Figure 3A:
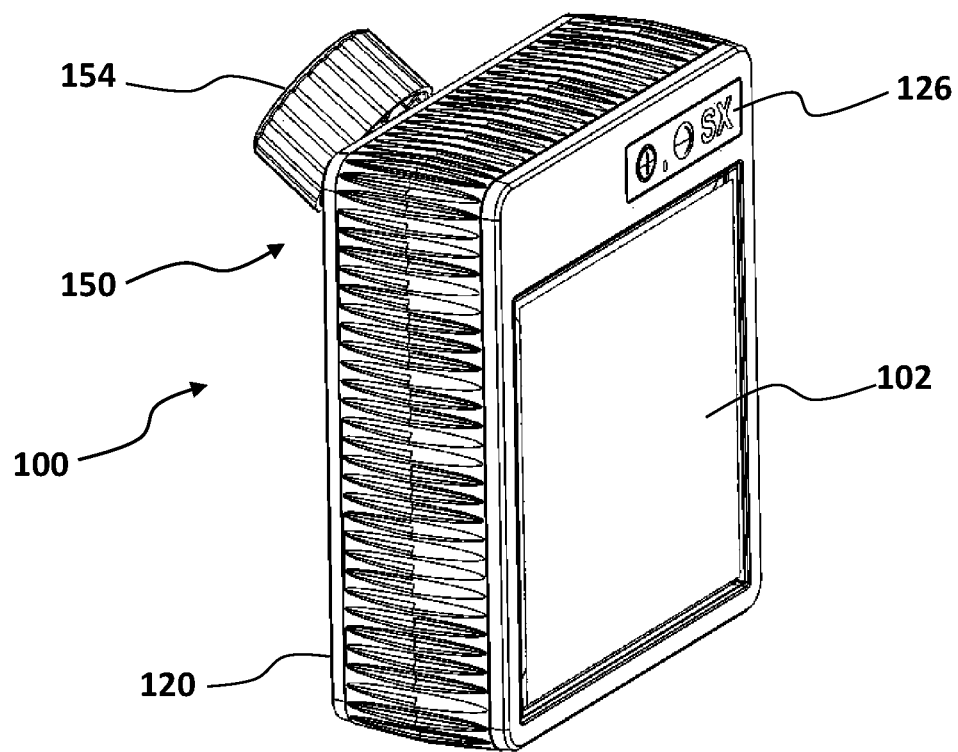
FIG. 3A is a front perspective view of a first example of an electric fence energizer.
Figure 3B:
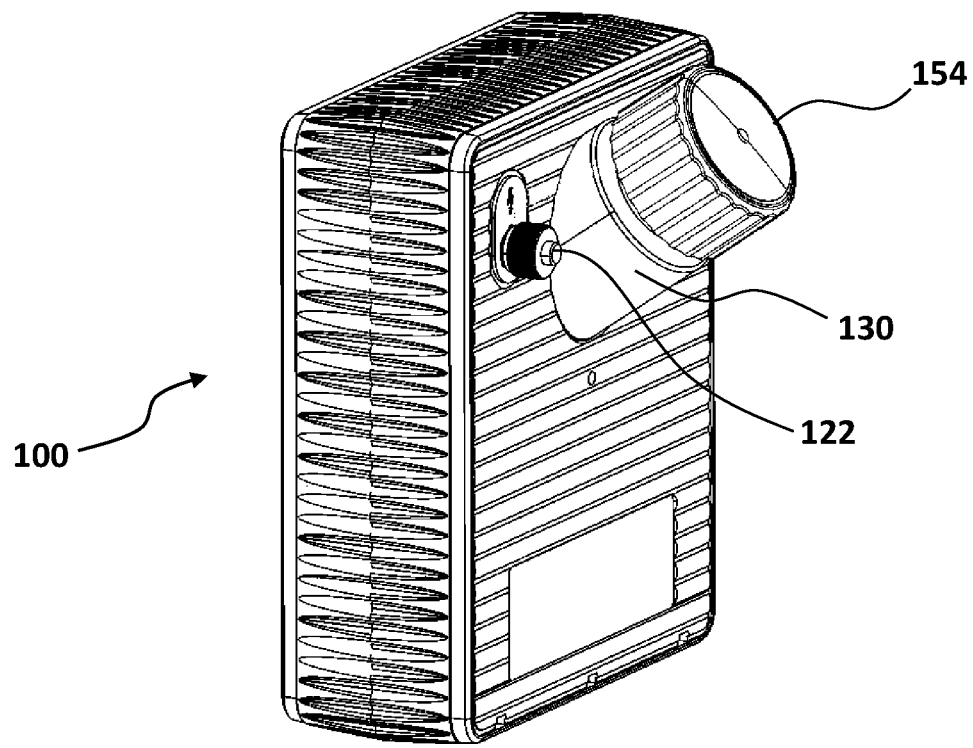
FIG. 3B is a rear perspective view of the electric fence energizer.
Figure 3C:
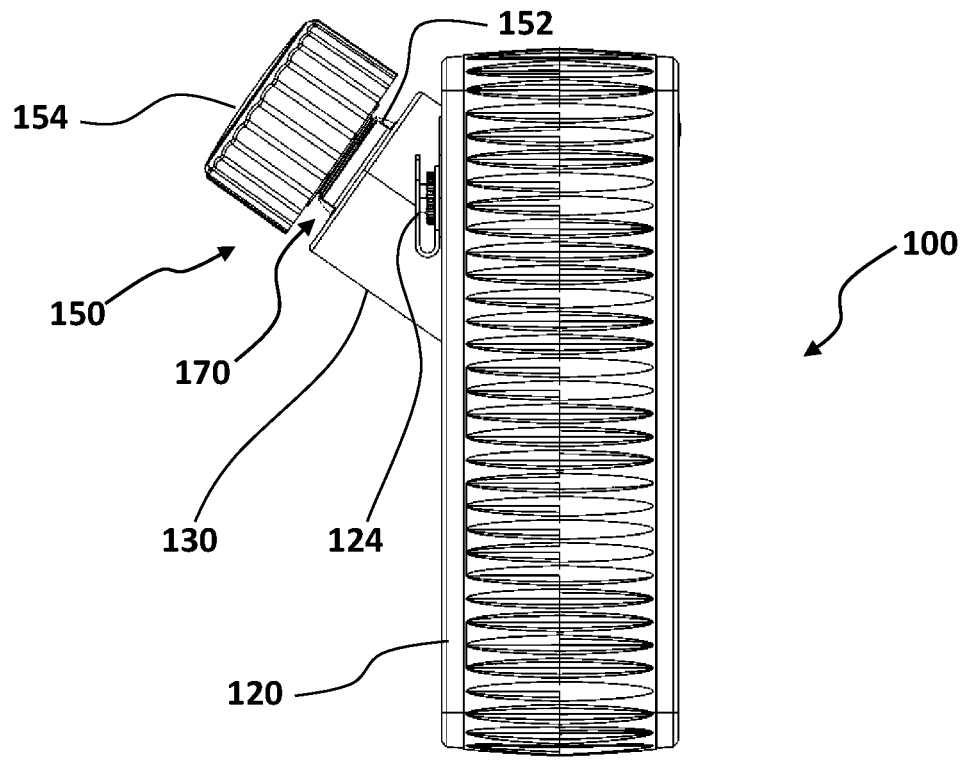
FIG. 3C is a side view of the electric fence energizer.

FIG. 3A to 3C show a first example of a solar energizer 100 according to one aspect of the present technology. The solar energizer 100 includes a housing 120. In this example, a solar panel 102 is integrated into the housing 120. In this example, an output terminal 122 is provided for connection of a lead to the fence network 116 (as generally illustrated in FIG. 2). A charging terminal 124 is also provided for charging of battery(s) 106. In this example, a display 126 is provided for visual display of indications of operation of the energizer 100—for example, battery and/or fence performance.

A securing mechanism support portion 130 extends from the housing 120. In an example, the support portion 130 may be a separate component to the main body of the housing 120. Alternatively, the support portion 130 may be integral with the main body of the housing 120.

A first example of a post securing mechanism 150 for securing the energizer 100 to a post 200 is provided on the support portion 130. In this example, the post securing mechanism 150 includes a post locating shaft 152 and a clamping knob 154. In this example the shaft 152 is integral with the support portion 130, and made of a plastics material. In alternative examples the shaft 152 and support portion 130 may be separate components, and in further examples the shaft 152 may be made of an electrically conductive material.

Figure 3D:
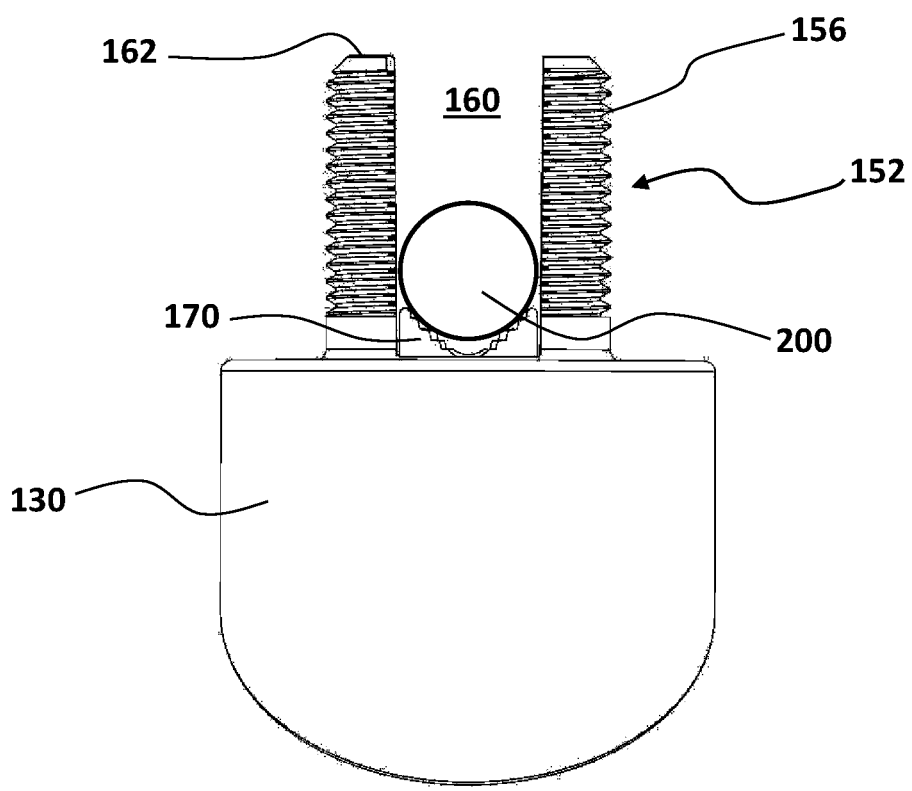
FIG. 3D is a front view of a post securing mechanism of the electric fence energizer.
Figure 3E:
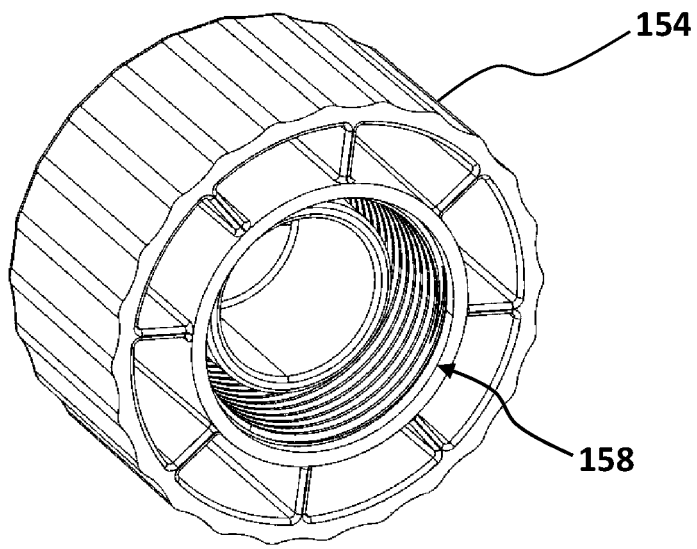
FIG. 3E is a perspective view of a clamping member of the post securing mechanism.

Referring to FIG. 3D, the shaft 152 includes an external thread 156, while in FIG. 3E it may be seen that the knob 154 includes a complementary internal thread 158. In use, the knob 154 is screwed onto the shaft 152. Referring to FIG. 3D, the shaft 152 has a slot 160 extending from a free end 162 of the shaft 152 to the support portion 130. A first example of an electrical contact 170 is provided at the base of the shaft 152 within the slot 160, seated on the support portion 130.

Figure 3F:
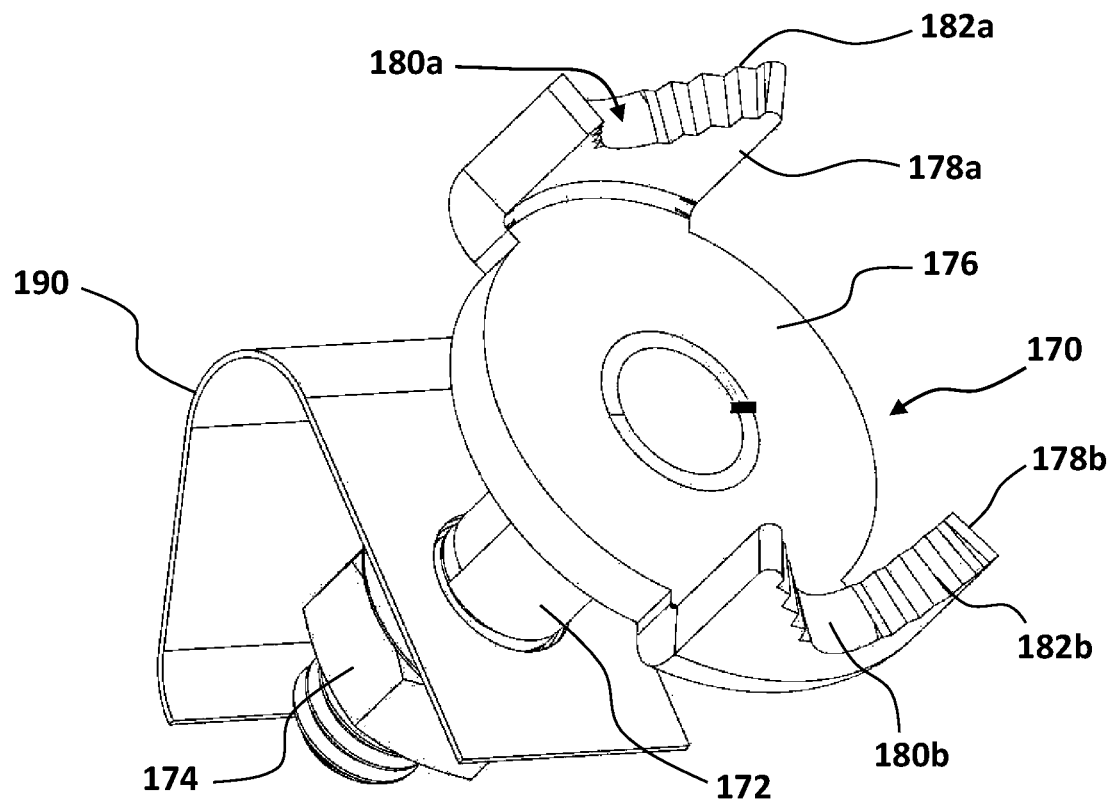
FIG. 3F is a perspective view of electrically conductive components of the post securing mechanism.

In use, a portion of post 200 may be received in the slot 160, and the knob 154 applied to the shaft 152 to clamp the post 200 against the electrical contact 170. Referring to FIG. 3F, the electrical contact 170 includes a contact shaft 172 which passes through an aperture of a contact link 190. A nut 174 on the contact shaft 172 is tightened to bear against the contact link 190 and encourage an electrical connection. The contact shaft 172 extends from a head 176 of the electrical contact 170. A first post contact portion 178a and a second post contact portion 178b extend from the head 176. Each post contact portion 178 includes a post receiving recess 180 shaped to cradle the post 200, with teeth 182 provided to grip the post 200 and resist axial movement (e.g. reduce the likelihood of the energizer 100 slipping down the post 200).

Figure 3G:
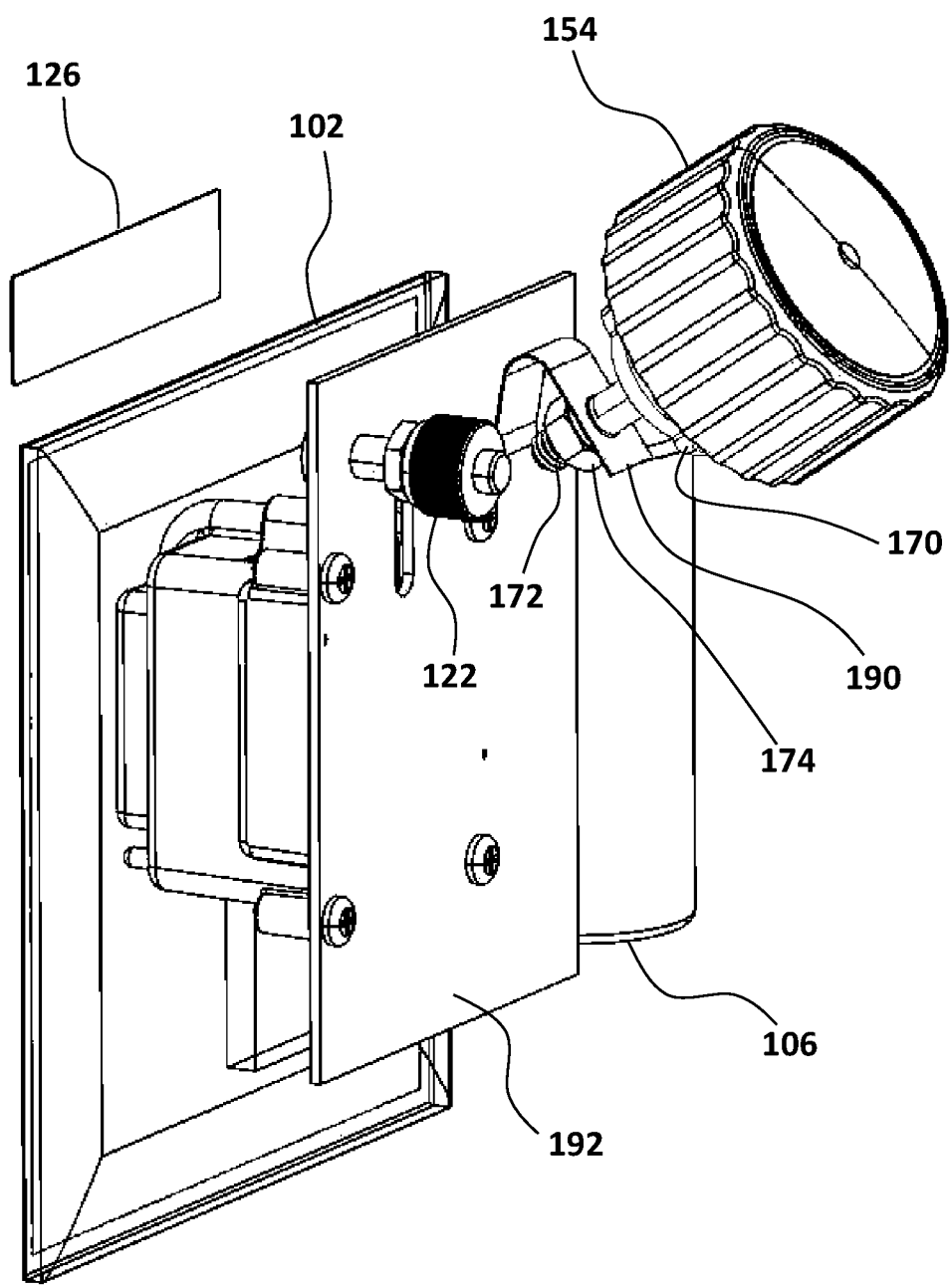
FIG. 3G is a rear perspective view of electrical components of the electric fence energizer.

Referring to FIG. 3G, the contact link 190 is connected to a PCB 192 of the electric pulse generating circuit 118. The resulting electrical pathway between the post 200, electrical contact 170, and contact link 190 provides the electric pulse generating circuit 118 with an earth connection to the ground (as generally illustrated in FIG. 2).

In the example shown in FIG. 4A to 4D, the energizer 100 is generally configured as described above, but has a second example of a post securing mechanism 400. In this example, the post securing mechanism 400 includes a conductive clamping member 402 configured to act as the electrical contact. In this example, the conductive clamping member 402 is shaped as a flat disk, having a locating slot 402 extending inwardly from an outer edge. The post securing mechanism 400 includes a pivot pin 406 and a locating pin 408 extending from the support portion 130. The pivot pin 406 extends through an aperture (not clearly shown) in the conductive clamping member 402, and the conductive clamping member 402 may pivot about the pivot pin 406 between (a) a closed position in which the locating pin 408 is received in the locating slot 402 (as shown), and (b) an open position in which the conductive clamping member 402 extends from the side of the support portion 130. In this example, the conductive clamping member 402 is located on the pivot pin 406 using a pivot pin nut 410.

Figure 4A:
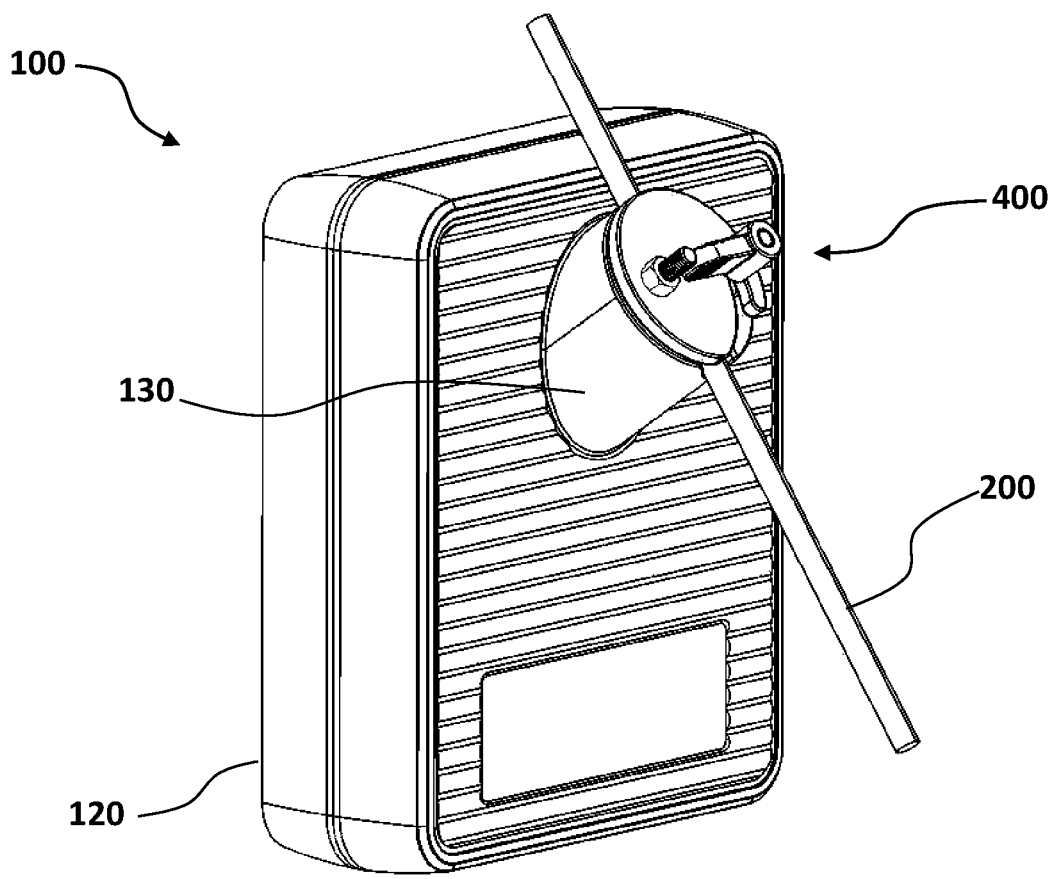
FIG. 4A is a rear perspective view of a second example of an electric fence energizer.
Figure 4B:
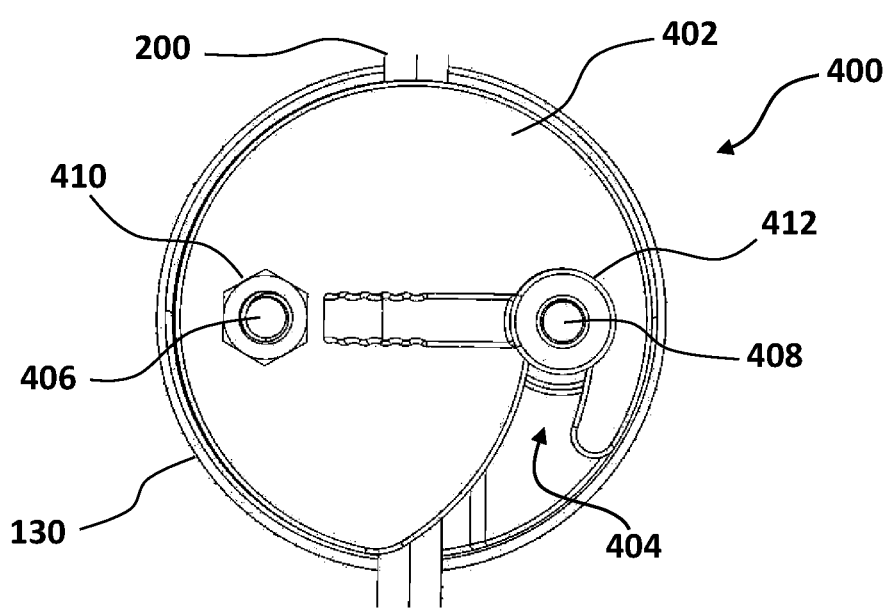
FIG. 4B is a rear view of a post securing mechanism of the electric fence energizer.
Figure 4C:
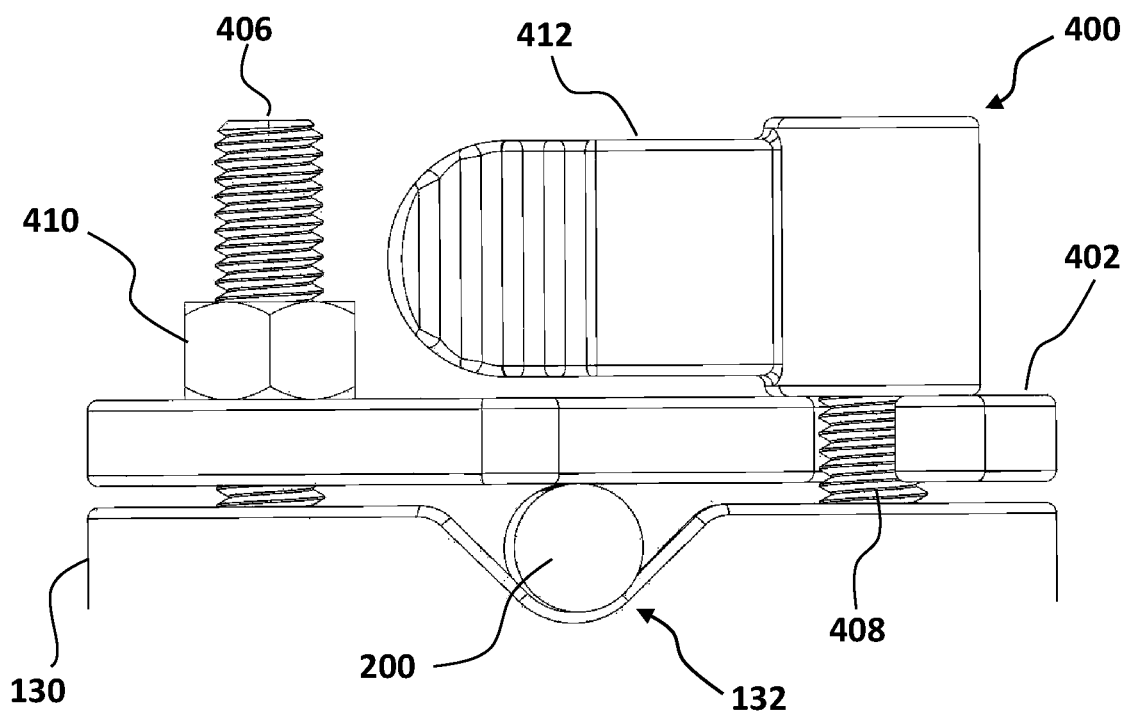
FIG. 4C is a bottom view of the post securing mechanism.

A flanged clamping nut 412 is provided on the locating pin 408 to facilitate securing and releasing of the conductive clamping member 402 at the closed position. Referring to FIG. 4C, in this example the support portion 130 includes a post locating recess 132. In use, the conductive clamping member 402 may be opened, a post 200 positioned in the post locating recess 132, the conductive clamping member 402 closed, and the flanged clamping nut 412 tightened to clamp the post 200 between the conductive clamping member 402 and the support portion 130.

Figure 4D:
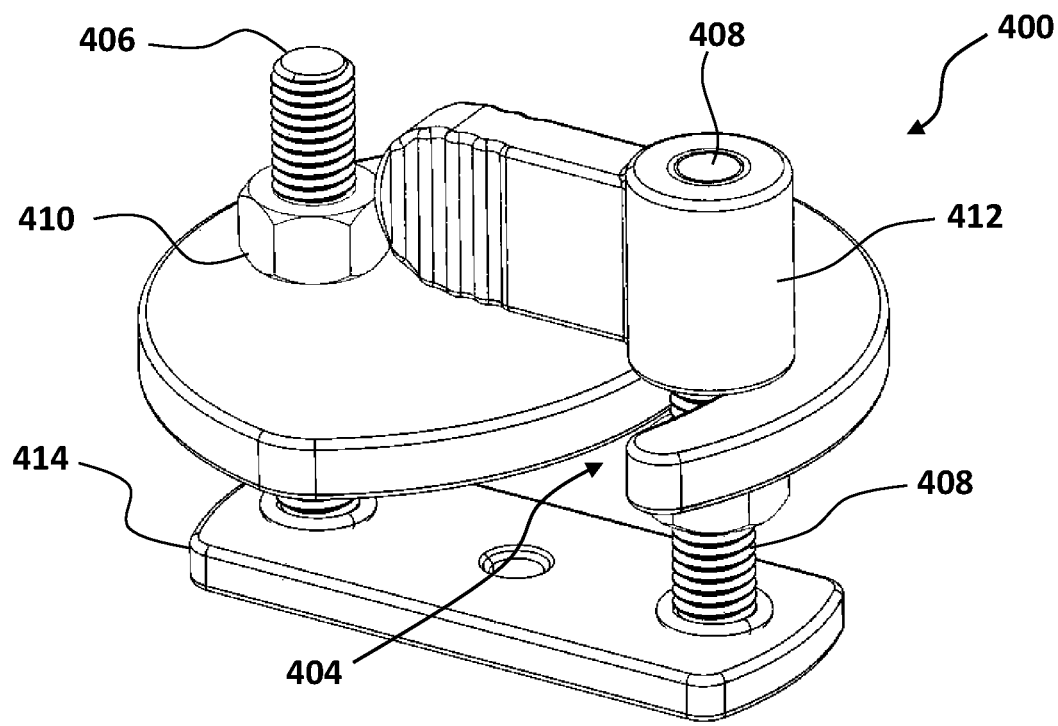
FIG. 4D is a perspective view of the post securing mechanism.

Referring to FIG. 4D, the pivot pin 406 and locating pin 408 extend into an interior of the support portion 130, and connect to a contact bar 414. For completeness, at least one of the pivot pin 406 and locating pin 408 are made of an electrically conductive material, providing an electrically conductive pathway from the post 200 through the conductive clamping member 402 to the contact bar 414. Further conductive links may be used to provide an earth connection to the electric pulse generating circuit 118 (as generally illustrated in FIG. 2).

Figure 5:
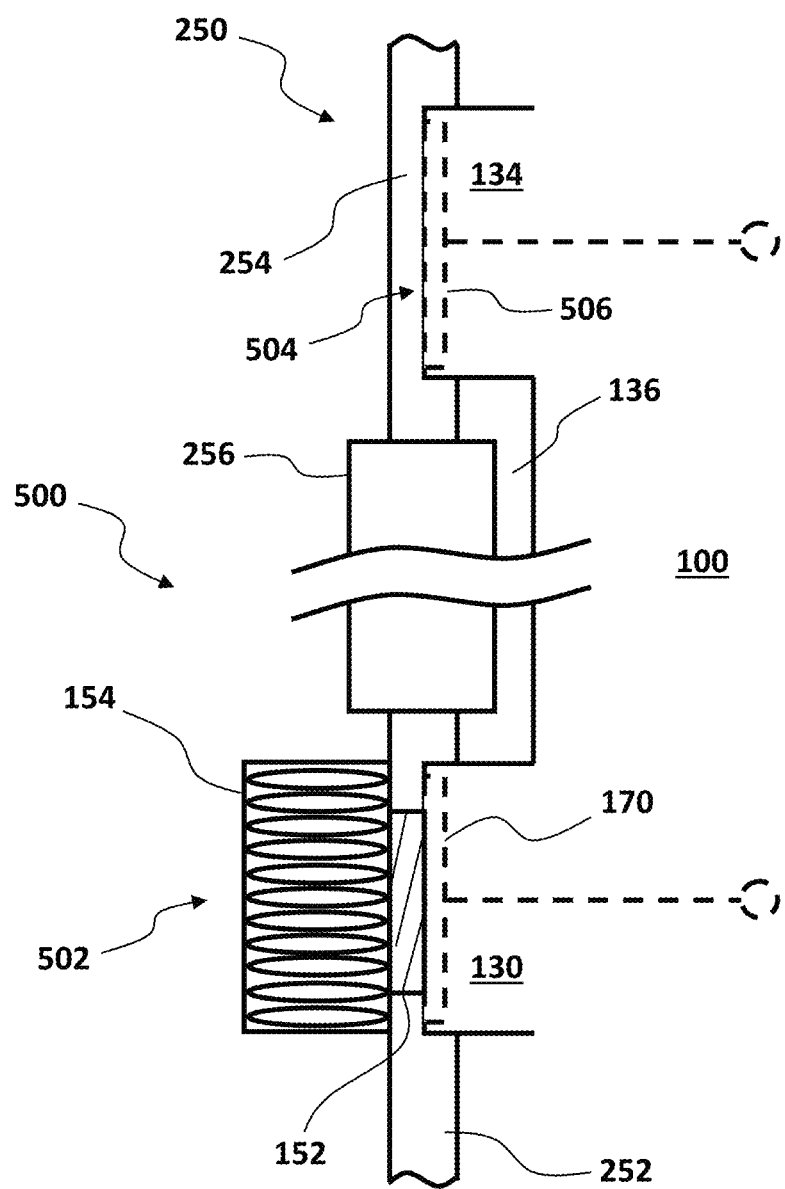
FIG. 5 is a side view of a post securing mechanism of a third example of an electric fence energizer.

Referring to FIG. 5, in an example the energizer 100 may be configured to be mounted to a post 250 including a lower portion 252 configured to be inserted into the ground, and an upper portion 254 including an electrically conductive wire support (not illustrated) configured to support a wire of the fence network 116. The lower portion 252 and the upper portion 254 may be electrically insulated from each other, for example using an insulator portion 256 therebetween.

In such an example, the energizer 100 may be configured to deliver electric shocks to the upper portion 254 of the post 250, eliminating the need to connect an output of an energizer 100 to the fence network 116 using a lead. In the example illustrated, the post securing mechanism 500 includes an earth connection portion 502 generally as described above with reference to FIG. 3A to FIG. 3G (i.e. having a slotted shaft 152 receiving the lower portion 252 of the post 250, with clamping knob 154 bearing the lower portion 252 against electrical contact 170).

The post securing mechanism 500 further includes a fence connection portion 504, including a second support portion 134. The second support portion 134 may include an upper post locating portion (not illustrated, but see post locating recess 132 of FIG. 4C as an example) in which a second electrical contact 506 may be positioned. In examples, the housing 120 and/or support portions 130/134 may be shaped to accommodate the insulator portion 256 of the post 250, for example using an insulator recess portion 136.

It is envisaged that the clamping mechanism of the earth connection portion 502 may be sufficient to locate the post 250 relative to the energizer 100, and as such in this example a second clamping mechanism is not provided at the fence connection portion 504. However, in alternative examples more than one clamping mechanism may be provided. Further, it should be appreciated that the clamping mechanism may be provided at the fence connection portion 504 instead of the earth connection portion 502.

In a further alternative example, the clamping mechanism may act against the intermediary insulator portion 256. In such an example, the energizer 100 may include a support against which the insulator portion 256 bears, or may rely on the support portions 130/134.

Figure 6:
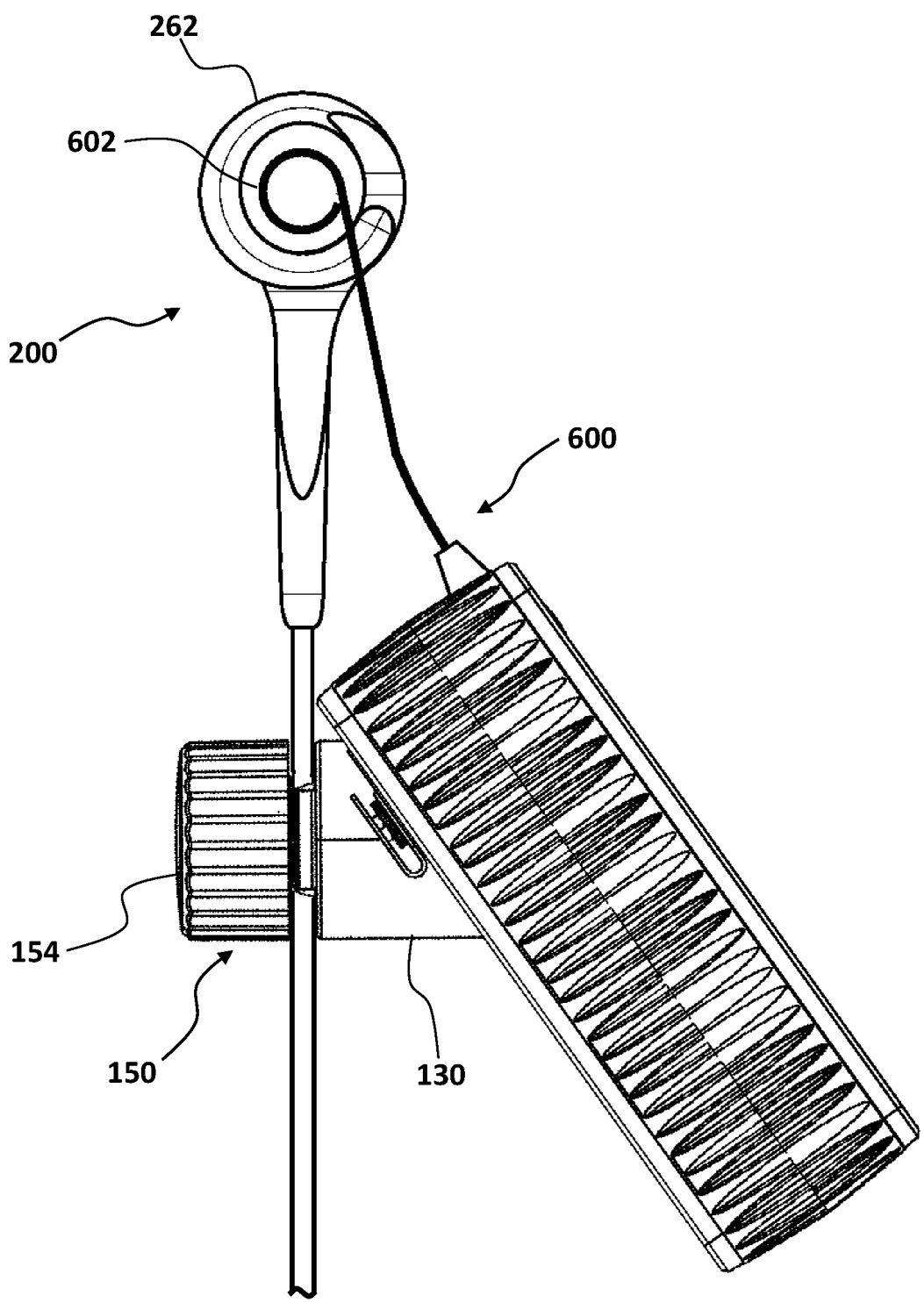
FIG. 6 is a side view of a post securing mechanism of a fourth example of an electric fence energizer.

Referring to FIG. 6, in this example the energizer 100 includes a post securing mechanism as generally described with reference to FIG. 3A to FIG. 3G above. In this example, the energizer 100 is configured to be secured to an electrically conductive shaft 260 of the fence post 200. In examples the fence post 200 includes a wire support portion 262 (in this example, provided on the head of the post 200) for supporting a wire of the fence network 116, however in other examples may not have any other function other than a post for the energizer (i.e. not include any wire support portions). In this example, the energizer 100 includes a fence connection portion 600 having an electrically conductive wire support 602 configured to retain and support the wire of the fence network 116. The electrically conductive wire support 602 is connected to the energizer output circuit 114, so as to deliver electric shocks to the fence network 116.

Figure 7A:
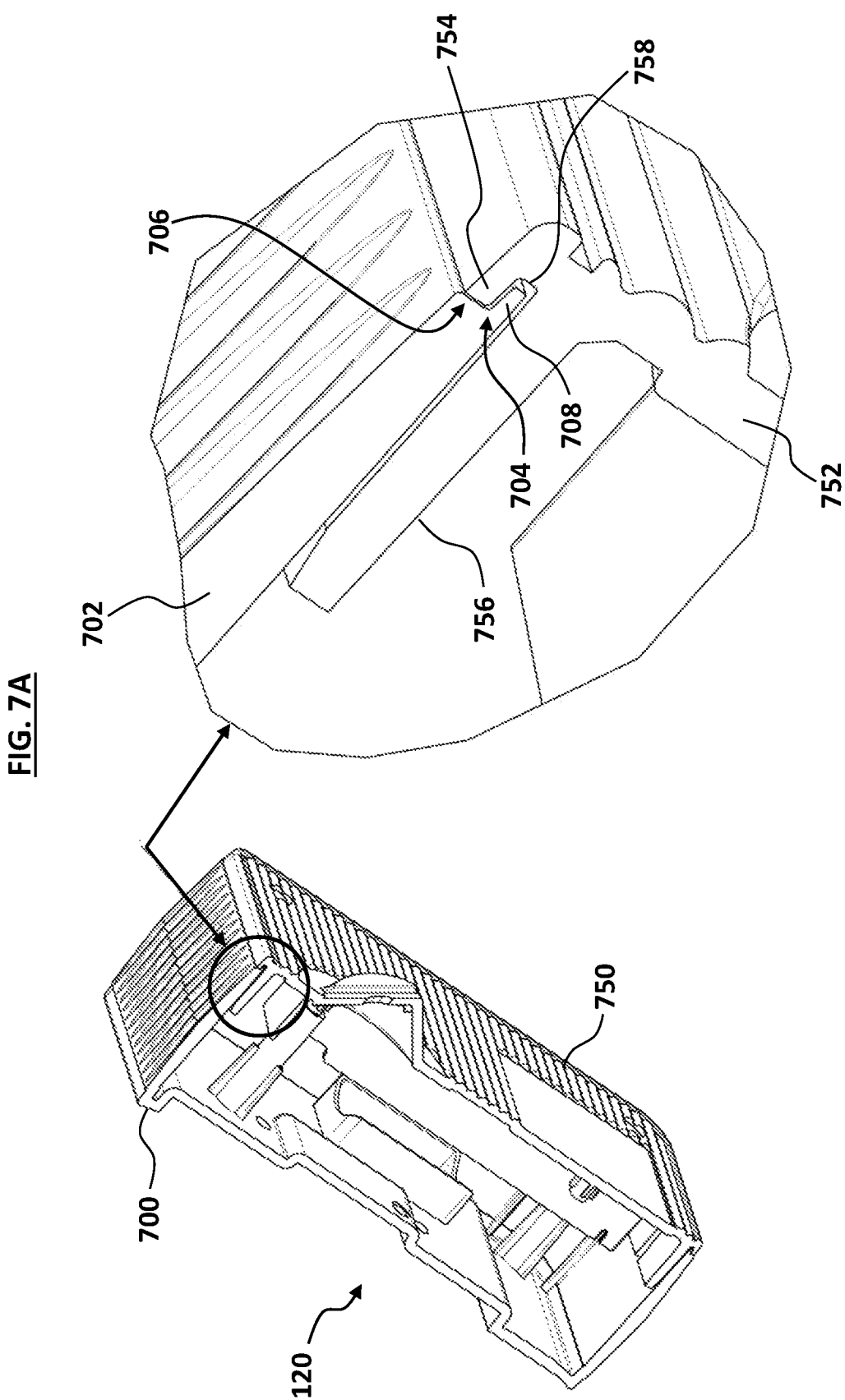
FIG. 7A is cross-sectional view of an exemplary housing of an electric fence energizer.
Figure 7B:
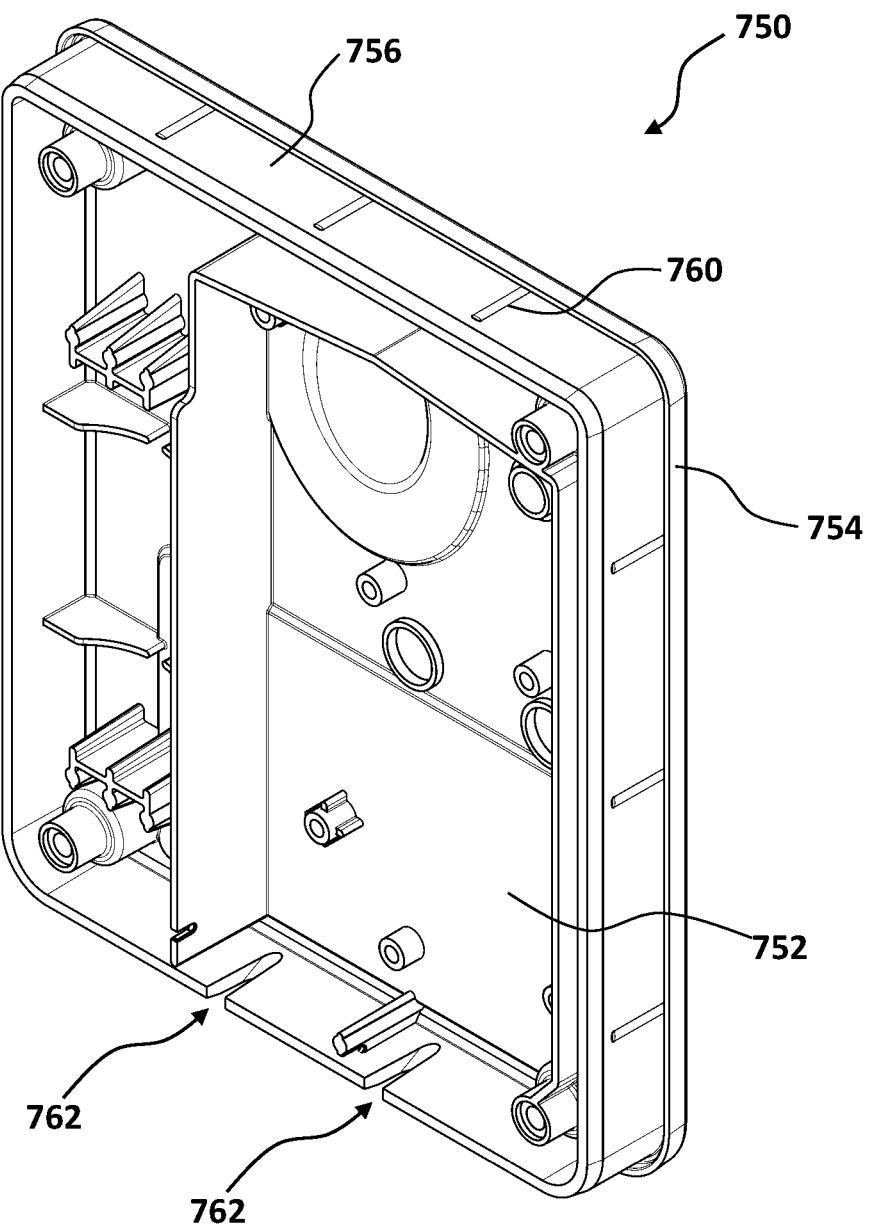
FIG. 7B is a perspective view of a rear housing member of the housing.

Referring to FIG. 7A and FIG. 7B, one aspect of the present technology provides a housing 120 including a front housing member 700 and rear housing member 750. The front housing member 700 and rear housing member 750 are configured to be secured to each other to provide the enclosure for the electrical components of the energizer. A labyrinth perimeter seal is provided between the front housing member 700 and the rear housing member 750, the labyrinth perimeter seal including an airgap and configured to permit airflow between the interior and exterior of the enclosure, and inhibit ingress of water into the enclosure. This assists with heat transfer and/or gas build up from battery malfunction from the housing, while reducing the likelihood of water damage to the internals of the energizer. It will be appreciated that the size of the gap may be dependent on the volume of the enclosure to be vented and the perimeter length of the housing, but by way of example, the airgap in the illustrated example is a minimum of 0.1 mm.

The front housing member 700 includes a front peripheral wall 702, with the edge of the front peripheral wall 702 having a shoulder 704 forming a rear facing surface 706, and inner locating flange 708. The rear housing member 750 includes a rear wall 752, with an outer peripheral flange 754 extending forwards from the rear wall 752 and an inner flange 756 also extending forwards from the rear wall 752, with a locating recess 758 therebetween. The labyrinth seal is formed by the gap between the aforementioned features of the front housing member 700 and the rear housing member 750.

In this example, spacer features 760 are provided on the surface of the inner flange 756 facing the front peripheral wall 702. The spacing features 760 extend in the front to rear direction, ensuring that an air gap is maintained. Further, internal stops between the front housing member 700 and the rear housing member 750 ensure that minimum gaps are maintained between the rear facing surface 706 and outer peripheral flange 754, and the inner locating flange 708 and the locating recess 758.

In examples, the airgap of the labyrinth perimeter seal may be greater through the inferior portion of the housing 120 (i.e. the downward facing part of the housing in use) than the superior portion (i.e. the upward facing part the housing in use). For example, the minimum gap though the superior portion may be in the order of 0.1 mm, while the minimum gap through the inferior portion may be in the order of 0.2 mm. It is envisaged that this may assist with draining water from the interior of the enclosure. Referring to FIG. 7B, this may be assisted by provision of drainage slots 762 in the inferior portion of the housing 120, proximal to the rear wall 752.

Referring to FIG. 8A to FIG. 8D, according to one aspect of the present technology the front housing member 700 includes a front wall 720, having a component recess 722. A wiring aperture 724 is provided in the component recess 722, through which wires connecting the photovoltaic device 102 to the internals of the energizer 100 pass. Panel spacing features 726 extend from the front wall 720, on which the photovoltaic device 102 is seated.

Fastener apertures 728 are also provided in the front wall 720. The photovoltaic device 102 is secured in place by an adhesive ring 730, surrounding the component recess 722. In addition to securing the photovoltaic device 102, the adhesive ring 730 provides a watertight seal to prevent the passage of water to, and through, the wiring aperture 724. In examples, the adhesive is a silicone sealant such as the DOWSIL™ 734 Flowable Sealant supplied by Dow Inc.

The adhesive passes through the fastener apertures 728, and expands to form an anchor on the interior of the enclosure once set—i.e. creating a mechanical securing mechanism in addition to the adhesive connection to the surface of the front wall 720. In the example illustrated, anchor baffles 740 are provided to each fastener aperture 728 in order to encourage formation of the anchors.

Each anchor baffle 740 includes an annular wall 742 surrounding, and offset from, the fastener aperture 728. Inner support walls 744 extend inwardly from the annular wall 742 to the fastener aperture 728, with a baffle member 746 spanning between the inner support walls 744 across the fastener aperture 728. As the adhesive 730 extrudes through the fastener aperture 728, it is diverted laterally by the baffle member 746 to fill the volume bounded by the annular wall 742 and form the anchor.

Figure 8A:
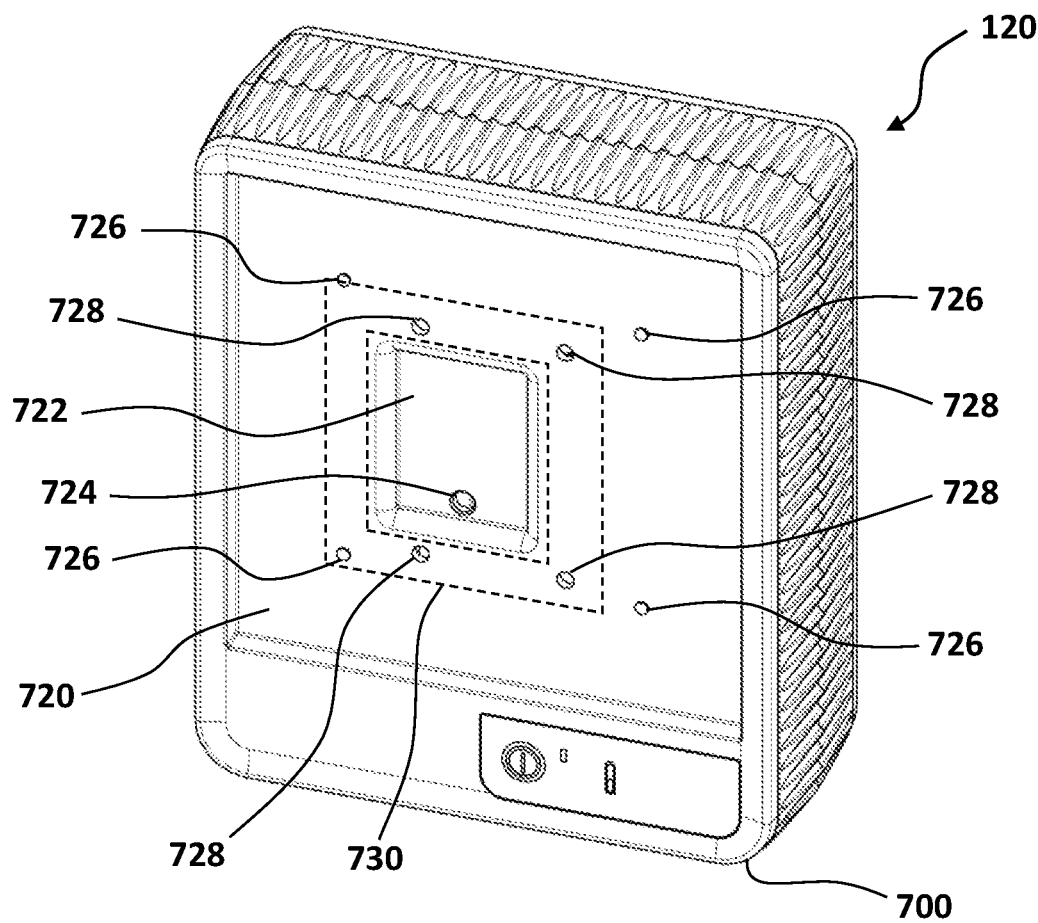
FIG. 8A is perspective view of the housing.
Figure 8B:
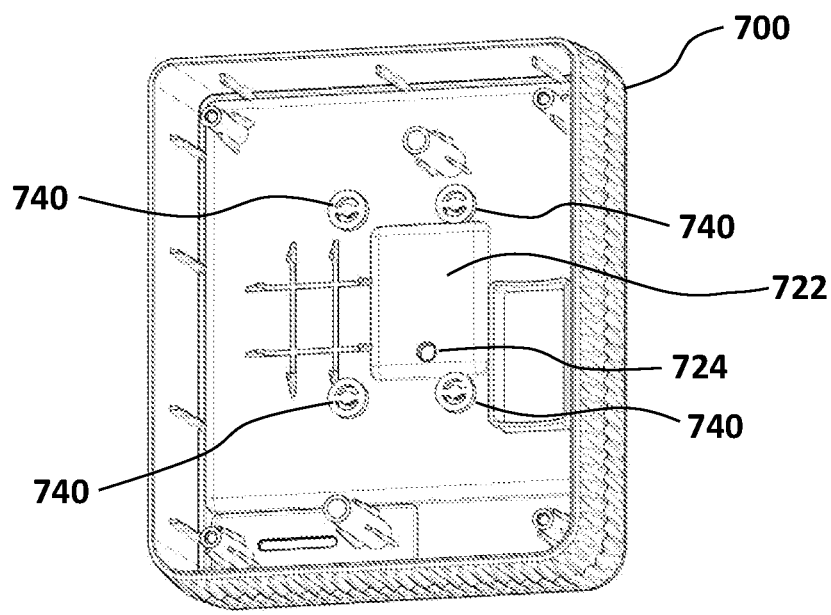
FIG. 8B is a perspective view of a front housing member of the housing.
Figure 8C:
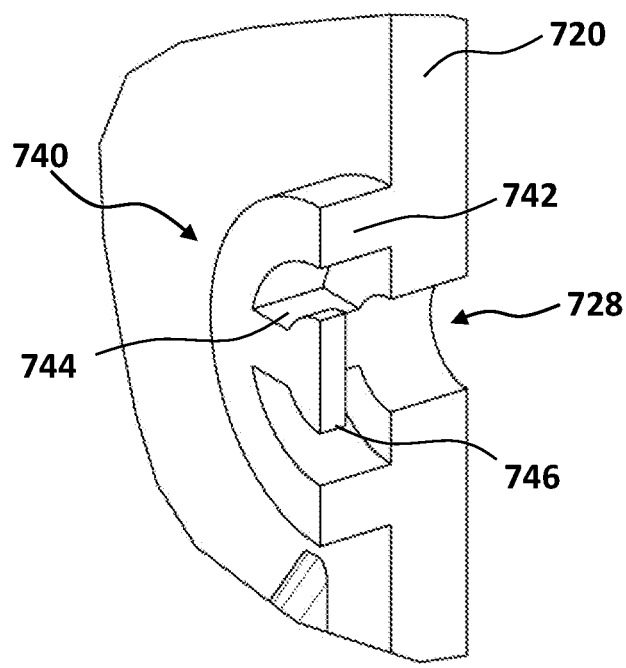
FIG. 8C is a perspective cross-sectional view of an anchor baffle of the front housing member.
Figure 8D:
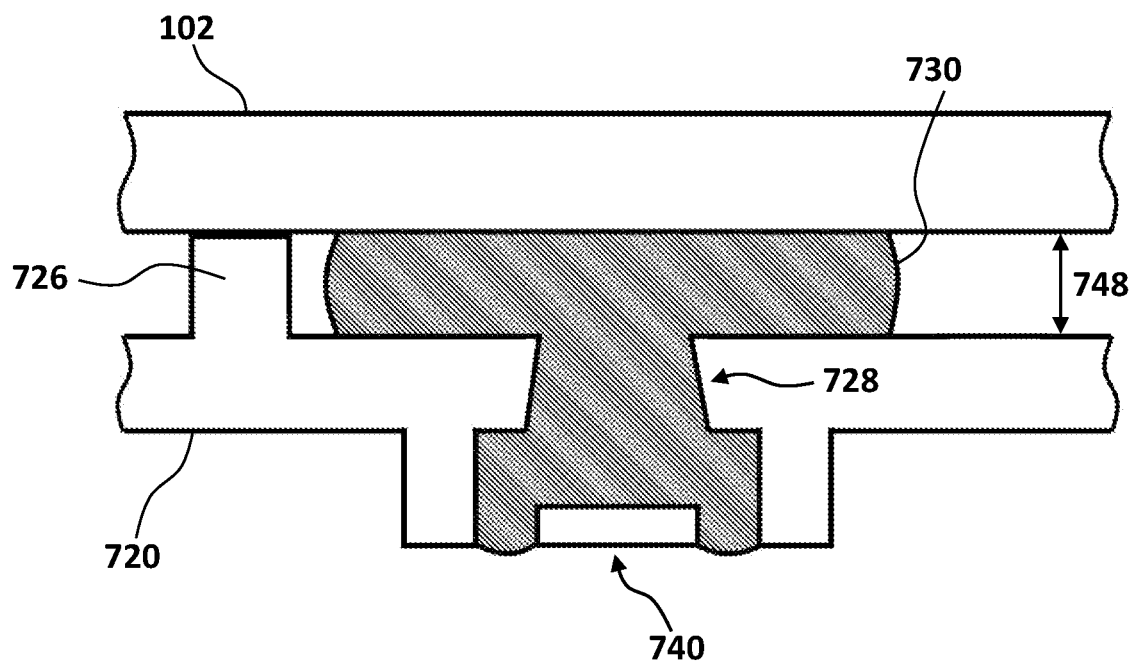
FIG. 8D is a cross-sectional view of the anchor baffle in use.

Referring to FIG. 8D, in examples the fastener aperture 728 may taper from the internal surface to the external surface. It is envisaged that this may increase mechanical resistance to the anchor being extracted through the fastener aperture 728. It should be appreciated that in alternative embodiments the anchoring effect may be achieved through tapering of the fastener aperture 728 without provision of the anchor baffle 740, with the larger diameter of adhesive at the internal surface resisting extraction towards the exterior surface.

It may also be seen in FIG. 7D that an air gap 748 is created by the panel spacing features 726 between the front wall 720 and the photovoltaic device 102. This air gap 748 is envisaged as assisting with reducing the transfer of heat from the photovoltaic device 102 into the enclosure of the housing 120. In an alternative embodiment, a heat insulating material (for example a thermally insulating foam), may be provided in the gap 748.

In examples, a gap may be provided at a superior and/or inferior edges of the air space between the photovoltaic device 102 and the front housing member 700. It is envisaged that this may assist with encouraging convection air flow through the gap(s) to aid in dispersion of heat, rather than such heat being transferred from the photovoltaic device 102 into the enclosure provided by the housing 120.

The entire disclosures of all applications, patents and publications cited above and below, if any, are herein incorporated by reference.

Reference to any prior art in this specification is not, and should not be taken as, an acknowledgement or any form of suggestion that that prior art forms part of the common general knowledge in the field of endeavour in any country in the world.

The present disclosure may also be said broadly to consist in the parts, elements and features referred to or indicated in the specification of the application, individually or collectively, in any or all combinations of two or more of said parts, elements or features.

Where in the foregoing description reference has been made to integers or components having known equivalents thereof, those integers are herein incorporated as if individually set forth.

It should be noted that various changes and modifications to the presently preferred embodiments described herein will be apparent to those skilled in the art. Such changes and modifications may be made without departing from the spirit and scope of the present disclosure and without diminishing its attendant advantages. It is therefore intended that such changes and modifications be included within the present disclosure.

The present disclosure may also be said broadly to consist in the parts, elements and features referred to or indicated in the specification of the application, individually or collectively, in any or all combinations of two or more of said parts, elements or features.

Aspects of the present invention have been described by way of example only and it should be appreciated that modifications and additions may be made thereto without departing from the scope thereof.

The invention claimed is:

1. A portable electric fence energizer including:
   a housing;
   an electric pulse generating circuit located within the housing;
   a post securing mechanism configured to secure the housing relative to an electrically conductive post, wherein the post securing mechanism includes:
      a post receiving portion into which a portion of the electrically conductive post may be inserted in use;
      a clamping member configured to be tightened to bear against the electrically conductive post to secure the electrically conductive post relative to the housing, and
      at least one electrical contact configured to contact the electrically conductive post when secured by the post securing mechanism, wherein the at least one electrical contact is positioned in the post receiving portion such that tightening of the clamping member bears the electrically conductive post against the at least one electrical contact; and
   a conductive link between the at least one electrical contact and the electric pulse generating circuit.

2. The portable electric fence energizer of claim 1, wherein the post receiving portion is a slot in the side of a shaft.

3. The portable electric fence energizer of claim 2, wherein the slot intersects at least one end of the shaft to allow for introduction or removal of the electrically conductive post through the at least one end.

4. The portable electric fence energizer of claim 1, wherein the at least one electrical contact is configured to provide an earth connection for the portable electric fence energizer.

5. The portable electric fence energizer of claim 1, wherein the at least one electrical contact is configured to provide an output connection between the electric pulse generating circuit and a wire of the electric fence.

6. The portable electric fence energizer of claim 1, wherein the portable electric fence energizer includes an output electrical contact and an earth electrical contact.

7. The portable electric fence energizer of claim 6, wherein the electrically conductive post includes a first conductive portion having an end configured to be inserted into the ground in use, a second conductive portion having a wire support configured to support a wire of the electric fence, wherein the first conductive portion is electrically insulated from the second conductive portion,
   wherein the portable electric fence energizer is configured such that when the electrically conductive post is secured to the housing using the post securing mechanism, in use, the earth electrical contact contacts the first conductive portion of the electrically conductive post, and the output electrical contact contacts the second conductive portion of the electrically conductive post.

8. The portable electric fence energizer of claim 1, including:
   a photovoltaic cell panel;
   wherein the housing includes a front wall having a wire aperture;
   wherein the photovoltaic cell panel is secured to the housing using an adhesive applied between the photovoltaic cell panel and the front wall, wherein the adhesive is formed in an annular ring surrounding the wire aperture to provide a watertight seal.

9. The portable electric fence energizer of claim 8, wherein the front wall includes a plurality of fastener apertures, wherein the adhesive is applied between the photovoltaic cell panel and an exterior surface of the front wall, wherein the adhesive extends through each of the fastener apertures and forms a plurality of expanded anchor portions on an interior surface of the front wall.

10. The portable electric fence energizer of claim 9, wherein the housing includes a plurality of anchor baffles, each anchor baffle provided to a respective fastener aperture, each anchor baffle including a baffle surface facing the faster aperture, such that adhesive extruded through the fastener aperture contacts the baffle surface and is directed laterally across the interior surface of the front wall.

11. The portable electric fence energizer of claim 9, wherein each fastener aperture is tapered between the interior surface and the exterior surface such that a cross-sectional area of the fastener aperture at the interior surface is greater than a cross-sectional area of the fastener aperture at the exterior surface.

12. The portable electric fence energizer of claim 8, wherein the front wall includes a plurality of panel spacing members against which the photovoltaic cell panel is seated, such that an air gap is provided between the photovoltaic cell panel and the front wall.

13. The portable electric fence energizer of claim 8, wherein the housing includes:
a first housing member;
a second housing member, wherein the second housing member is configured to be secured to the first housing member to provide an enclosure in which the electric pulse generating circuit is located; and
wherein the housing includes a labyrinth perimeter seal between the first housing member and the second housing member, the labyrinth perimeter seal including an airgap and configured to permit airflow between an interior of the enclosure and an exterior of the enclosure, and inhibit ingress of liquid into the enclosure.

14. The portable electric fence energizer of claim 13, wherein the first housing member includes a first labyrinth perimeter seal surface, and the second housing member includes a second labyrinth perimeter seal surface, wherein the first labyrinth perimeter seal surface faces the second labyrinth perimeter seal surface, and the first labyrinth perimeter seal surface and the second labyrinth perimeter seal surface are separated by a plurality of spacer features.

15. The portable electric fence energizer of claim 14, wherein the housing includes a peripheral wall around which the labyrinth perimeter seal extends, wherein the peripheral wall includes a superior facing portion and an inferior facing portion, wherein the airgap of the labyrinth perimeter seal is greater through the inferior portion than the superior portion.

16. A system including:
an electrically conductive post; and
a portable electric fence energizer, including:
a housing;
an electric pulse generating circuit located within the housing;
a post securing mechanism configured to secure the housing relative to an electrically conductive post, wherein the post securing mechanism includes:
a post receiving portion into which a portion of the electrically conductive post may be inserted in use;
a clamping member configured to be tightened to bear against the electrically conductive post to secure the electrically conductive post relative to the housing; and
at least one electrical contact configured to contact the electrically conductive post when secured by the post securing mechanism, wherein the at least one electrical contact is positioned in the post receiving portion such that tightening of the clamping member bears the electrically conductive post against the at least one electrical contact; and
a conductive link between the at least one electrical contact and the electric pulse generating circuit; and
wherein the portable electric fence energizer is secured to the electrically conductive post using the post securing mechanism such that the at least one electrical contact contacts the electrically conductive post.

17. The portable electric fence energizer of claim 16, wherein the post receiving portion is a slot in the side of a shaft.

18. The system of claim 17, wherein the slot intersects at least one end of the shaft to allow for introduction or removal of the electrically conductive post through that end.

* * * * *